(12) United States Patent
Yamauchi et al.

(10) Patent No.: US 6,268,769 B1
(45) Date of Patent: Jul. 31, 2001

(54) OPERATIONAL AMPLIFIER

(75) Inventors: Atsushi Yamauchi; Naoto Yoshioka, both of Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/206,613

(22) Filed: Dec. 7, 1998

(30) Foreign Application Priority Data

Dec. 9, 1997 (JP) .................................................. 9-338984

(51) Int. Cl.$^7$ ....................................................... H03F 3/45
(52) U.S. Cl. ........................... 330/255; 330/255; 330/263
(58) Field of Search .................................. 330/255, 257, 330/263

(56) References Cited

U.S. PATENT DOCUMENTS 4,972,158 * 11/1990 Sutterlin ............................... 330/255
5,515,005  5/1996 Yoshioka ............................... 330/255

* cited by examiner

*Primary Examiner*—Michael B Shingleton
(74) *Attorney, Agent, or Firm*—Ostrolenk, Faber, Gerb & Soffen, LLP

(57) ABSTRACT

An operational amplifier includes a differential amplifier stage having positive and negative input terminals formed by a pair of differential amplifier circuits, a current mirror stage having a pair of current mirror circuits coupled to the differential amplifier stage and producing a common output, and a buffer circuit having a current source connected to the common output of the current mirror stage, wherein the buffer circuit includes a plurality of first input transistors and plurality of second input transistors. The buffer circuit has a diamond arrangement formed of a first output transistor, a second output transistor, at least one of the first input transistors, and at least one of the second input transistors.

5 Claims, 3 Drawing Sheets

OPERATIONAL AMPLIFIER

BACKGROUND OF THE INVENTION

1. Field of the Invention

The present invention relates to an operational amplifier, and more particularly, to an operational amplifier suited for use in portable communication equipment and the like.

2. Description of the Related Art

Japanese Unexamined Patent Publication No. 7-46059 shows a conventional operational amplifier (see FIG. 3). Referring to FIG. 3, an operational amplifier 100 comprises a differential amplifier stage 1, a current mirror stage 2, and a buffer circuit 3. The differential amplifier stage 1 includes first and second differential amplifier circuits 1a, 1b, respectively, arranged symmetrically with respect to a transverse center line of the circuit. The current mirror stage 2 comprises first and second current mirror circuits 2a, 2b, respectively, arranged symmetrically with respect to a transverse center line of the circuit. The buffer circuit 3 is connected to the common output of the current mirror circuits 2a, 2b.

The first differential amplifier circuit 1a is formed of a pair of NPN transistors Q1, Q2. The second differential amplifier circuit 1b is formed of a pair of PNP transistors Q3, Q4. The first current mirror circuit 2a comprises three PNP transistors Q5, Q6, and Q7. The second current mirror circuit 2b is made up of three NPN transistors Q8, Q9, and Q10. The buffer circuit 3 has a diamond arrangement, and includes two NPN transistors Q11, Q13, and two PNP transistors Q12, Q14. The buffer circuit is also provided with a PNP transistor Q15 and an NPN transistor Q16 which act as current sources. Transistors Q11, Q12 are first and second input transistors, respectively, and transistors Q13, Q14 are first and second output transistors, respectively.

In the above arrangement, the bases of transistors Q1, Q3 (which are taken from the first and second differential amplifier circuits 1a, 1b, respectively) are connected to a positive-phase input terminal IN1. The bases of the remaining transistors Q2, Q4, are connected to a negative-phase input terminal IN2. The collector of transistor Q1 is the output of the first differential amplifier circuit 1a, and is connected to the input of the first current mirror circuit 2a. The collector of transistor Q2 is connected to a positive power source +Vcc. The emitters of transistors Q1, Q2 are directly tied together and are connected to a first constant current circuit 4a. Further, the collector of transistor Q3 is the output of the second differential amplifier circuit 1b, and is connected to the input of the second current mirror circuit 2b. The collector of transistor Q4 is connected to a negative power source −Vcc. The emitters of transistors Q3, Q4 are directly tied together and are connected to a second constant current circuit 4b. The collectors of transistors Q7, Q10 (which are the outputs of the first and second current mirror circuits 2a, 2b, respectively) are connected to the positive and negative power sources +Vcc, −Vcc, respectively through respective phase compensating capacitors C1, C2. In addition, the collectors of transistors Q7 and Q10 are directly tied together and connected to the input of the buffer circuit 3.

In the buffer circuit 3, transistors Q15, Q16 are used as current sources for transistors Q11, Q12, respectively. More particularly, the collector of transistor Q15 is connected to a node between the emitter of transistor Q12 and the base of transistor Q13. The emitter of transistor Q15 is connected to the positive voltage +Vcc, and the base of transistor Q15 is connected to the bases of transistors Q5, Q6 (which are directly tied together) in the second current mirror circuit 2a. The collector of transistor Q16 is connected to a node between the emitter of transistor Q11 and the base of transistor Q14. The emitter of transistor Q16 is connected to the negative voltage −Vcc, and the base of transistor Q16 is connected to the bases of transistors Q8, Q9 (which are directly tied together) in the current mirror circuit 2b. Thus, the buffer circuit 3 is controlled with the operating current flowing in the current mirror stage 2, depending on an input signal voltage.

For the operational amplifier 100 described above to operate at a high speed and over a wide bandwidth, it is necessary to increase the mutual conductance of the differential amplifier stage 1 (i.e., converting a voltage in a current). To increase the mutual conductance of the differential amplifier stage 1, one must increase a current flowing in the differential amplifier stage 1.

In the above-described arrangement of the conventional operational amplifier 100, the increase of current flowing in the differential amplifier stage 1 is accomplished by enhancing the increasing change-ratio of current flowing in the first current mirror circuit 2a of the current mirror stage 2, and enhancing the decreasing change-ratio of current flowing in the second current mirror circuit 2b. As a result, the increasing change-ratio of the current in the first current mirror circuit 2a cannot be processed in the buffer circuit 3. The current which cannot be processed in the buffer circuit 3 begins to flow into the second current mirror circuit 2b in which the current is reduced. Accordingly, the second current mirror circuit 2b becomes saturated and cannot normally operate.

SUMMARY OF THE INVENTION

Accordingly, it is an object of the present invention to solve the above-described problems and to provide an operational amplifier in which a buffer circuit has a reduced input impedance and is capable of processing an increased amount of current.

According to the present invention, there is provided an operational amplifier which includes a differential amplifier stage having a positive input terminal and a negative input terminal, formed of a pair of differential amplifier circuits, a current mirror stage formed of a pair of current mirror circuits and connected to the outputs of the differential amplifier stage, and a buffer circuit having current sources connected to the common output of the current mirror stage, wherein the buffer circuit includes a plurality of first input transistors connected in parallel and a plurality of second input transistors connected in parallel.

Preferably, the buffer circuit further includes a first output transistor and a second output transistor, and has a diamond arrangement formed of the first output transistor, the second output transistor, at least one of the plurality of first input transistors, and at least one of the plurality of second input transistors.

More preferably, the remainder of the plurality of first input transistors and the remainder of the plurality of second input transistors are directly tied together and connected to the output.

In the operational amplifier of the present invention, since the buffer circuit includes the plurality of first input transistors and the plurality of second input transistors, the respective impedances of the plurality of first input transistors and the plurality of second input transistors are in parallel with each other. Thus, the input impedance of the buffer circuit is reduced.

DESCRIPTION OF THE PREFERRED EMBODIMENTS

Figure 1:
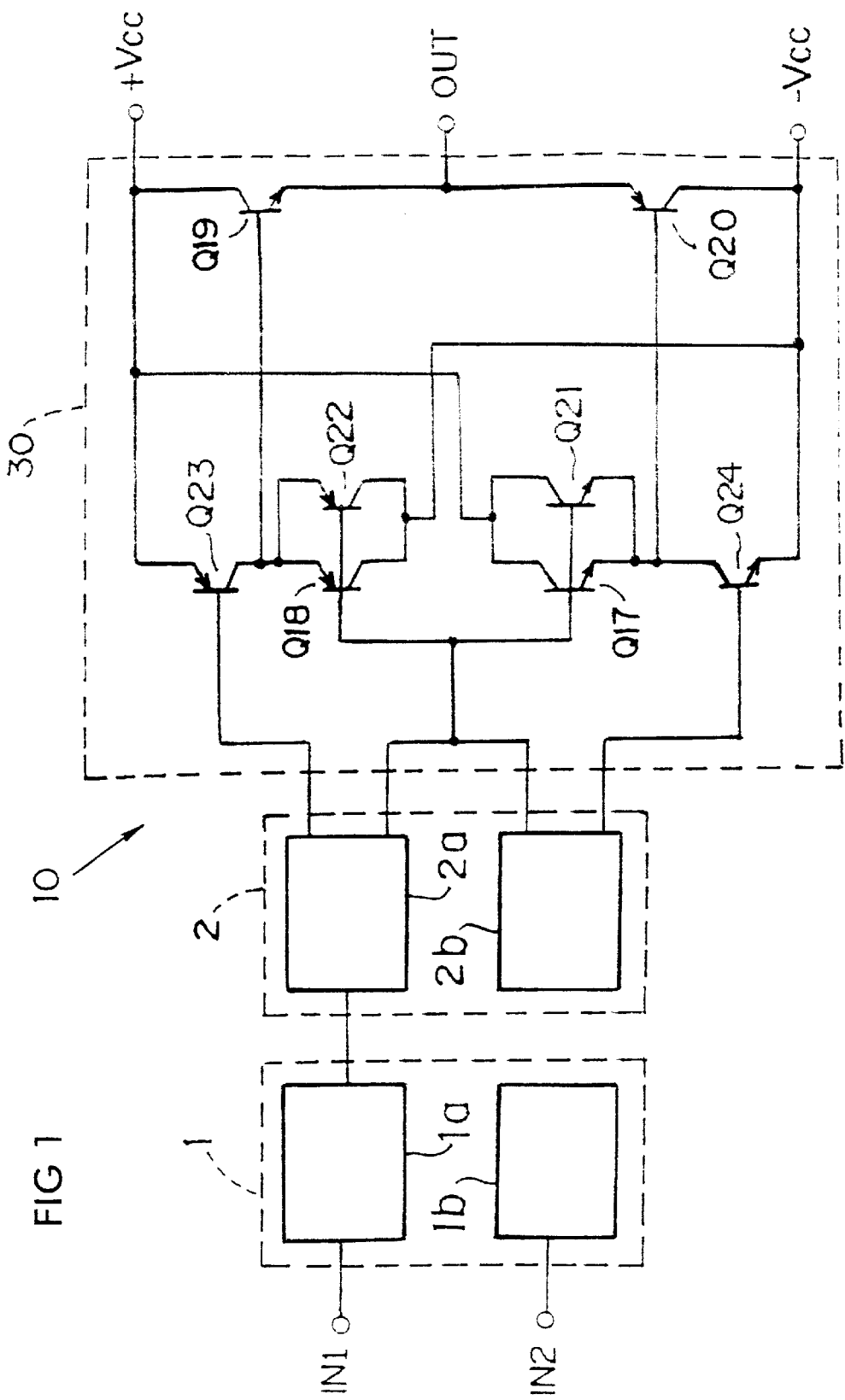
FIG. 1 is a circuit diagram of an operational amplifier according to a first embodiment of the present invention.

Preferred embodiments of the present invention will now be described with reference to the accompanying drawings. In the drawings, the same or like parts as those of the conventional operational amplifier 100 are designated by like reference numerals, and the detailed description of the parts is omitted.

In FIG. 1, there is shown a circuit diagram of an operational amplifier 10 according to an embodiment of the present invention. A buffer circuit 30 as an element of the operational amplifier 10 includes two first input transistors Q17, Q21 connected in parallel (i.e., having the respective emitters, collectors, and bases directly tied together) and two second input transistors Q18, Q22 also connected in parallel. In the buffer circuit 30, the first input transistors Q17, Q21, the second input transistors Q18, Q22, and the first and second output transistors Q19, Q20 form a diamond arrangement. Transistors Q23 and Q24 are used as respective current sources for the first input transistors Q17 and Q21 and for the second input transistors Q18 and Q22.

Since the buffer circuit 30 includes the plurality of first input transistors Q17, Q21, in parallel and the plurality of second input transistors Q18, Q22 in parallel, a current which flows in the buffer circuit 30 from the current mirror stage 2 can be divided to flow in the parallel-connected first input transistors Q17, Q21 and in the parallel-connected second input transistors Q18, Q22. As a result, the quantity of current processable in the buffer circuit 30 can be increased. Hence, the mutual conductance of the differential amplifier stage 1 which converts a voltage into a current can be enhanced. Therefore, the operational amplifier 10 can operate at a high speed and over a wide bandwidth. This high speed and wide bandwidth operation can be achieved with high stability and without a significant increase in current consumption by the buffer circuit 30.

In addition, the impedances of the first input transistors Q17, Q21 and the second input transistors Q18, Q22 are in parallel, which reduces the input impedance (R) of the buffer circuit 30. Thus, the first pole frequency (1/RC: a phase lag of 45°) at which the gain begins to roll off is shifted toward higher frequencies. Thus, an operational amplifier operating over a wide bandwidth is realizable in the amplifier 10 of the present invention.

Moreover, since the combined base resistances of the first input transistors Q17, Q21 and the second input transistors Q18, Q22 are reduced, the cut-off frequency (fc) of the plurality of first and second input transistors Q17, Q21 and Q18, Q22 ($fc = k1/[2\pi \cdot r_b \cdot [C_j + C']]$, where $r_b$ is a combined base resistance, $C_j$ is a junction capacitance, C' is a parasitic capacitance or phase compensating capacitance, and k1 is a proportional constant) is shifted toward higher frequencies. Thus, the operational amplifier 10 functions over wider bandwidths. In addition, since the second pole frequency of the operational amplifier 10 (i.e., the frequency at which the phase lag is inversely proportional to the combined base resistance $r_b$ becomes −180°) is enhanced, the phase margin increases. In addition, the through rate ($k2/[r_b \cdot [C_j + C']]$, where k2 is a proportional constant) is enhanced.

Moreover, since the first input transistors Q17, Q21, the second input transistors Q18, Q22, and the first and second output transistors Q19, Q20 form a diamond arrangement, all of the first and second input transistors Q17, Q21 and Q18, Q22, and the first and second output transistors Q19, Q20 in the buffer circuit 30 operate as an emitter follower (common-collector). Accordingly, the operational amplifier 10 exhibits improved high frequency performance, has improved skew characteristics, and can operate with stability over a wide bandwidth.

Figure 2:
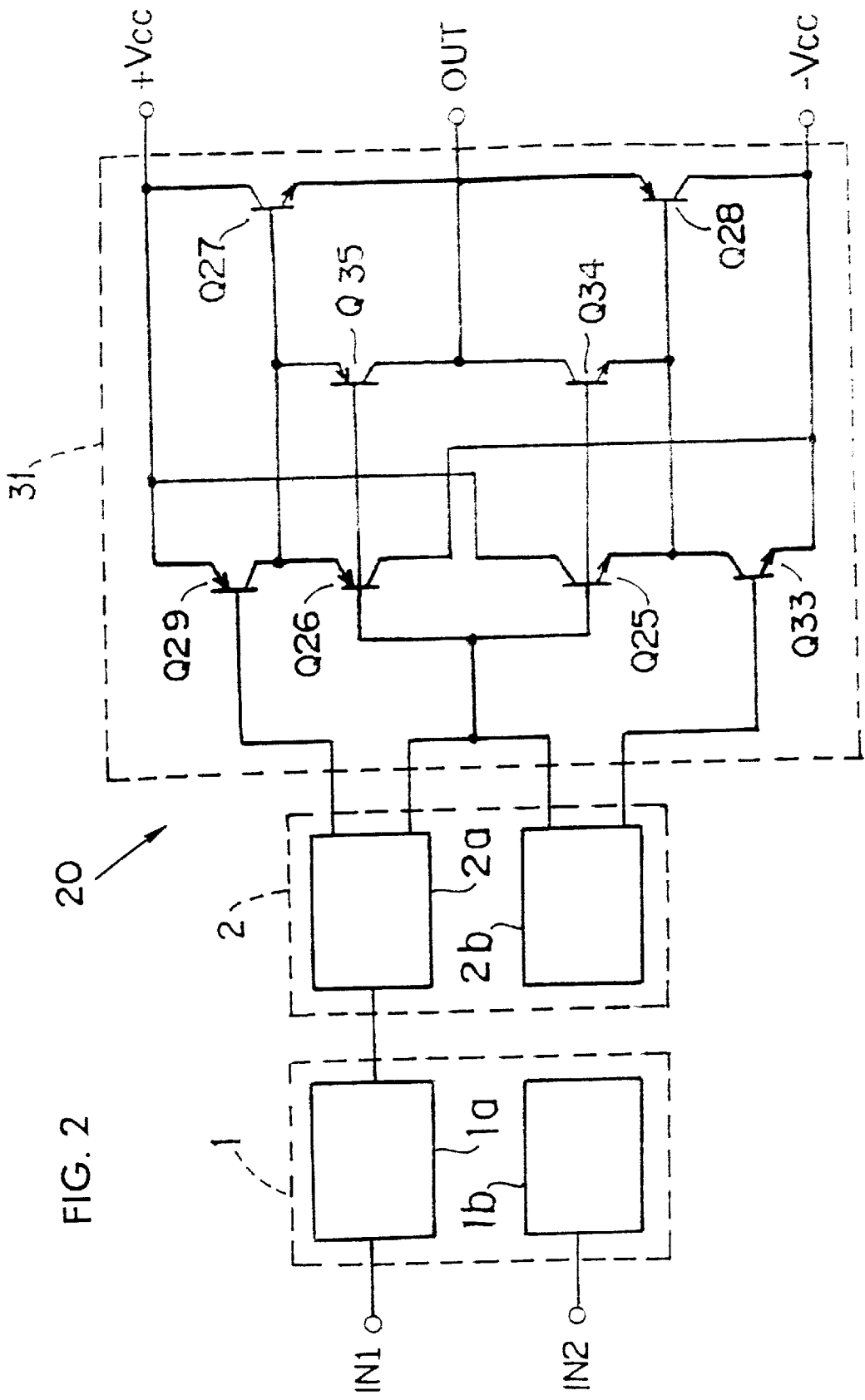
FIG. 2 is a circuit diagram of an operational amplifier according to a second embodiment of the present invention.

FIG. 2 is a circuit diagram of an operational amplifier 20 according to another embodiment of the present invention. The buffer circuit 31 of the operational amplifier 20 includes two first input transistors Q25, Q34 having their bases and emitters connected in parallel. The buffer circuit 31 also includes two second input transistors Q26, Q35 having their bases and emitters connected in parallel. In the buffer circuit 31, first input transistor Q25, second input transistor Q26, and first and second output transistors Q27, Q28 form a diamond arrangement. Transistors Q29 and Q33 are used as respective current sources for the first input transistors Q25 and Q34 and for the second input transistors Q26 and Q35.

The collector of the other first input transistor Q34 and the collector of the other second input transistor Q35 are directly tied together and connected to the output (OUT). Hence, the collector-emitter voltages of the first input transistor Q34 and the second input transistor Q35 are reduced. Accordingly, the current consumption in the buffer circuit 31 is reduced. In correspondence with the reduction of the current consumption, more current can flow in the differential amplifier stage 1 to increase the mutual conductance of the differential amplifier stage 1. Thus, the through rate of the operational amplifier 20 is further enhanced.

Figure 3:
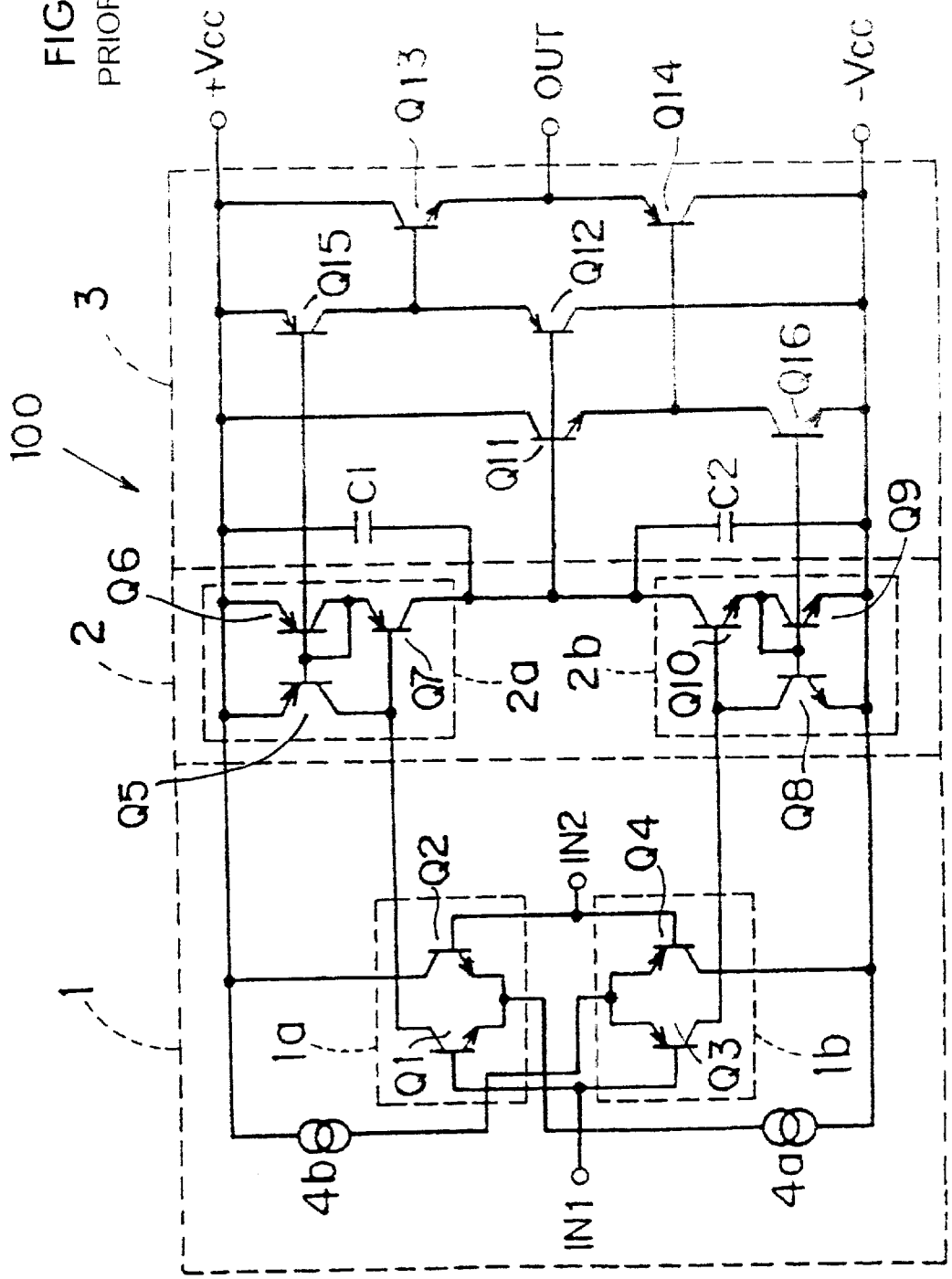
FIG. 3 is a circuit diagram of a conventional operational amplifier.

The through rates and the phase margins of the operational amplifier 10 of one embodiment (FIG. 1), the operational amplifier 20 (FIG. 2) of another embodiment, and the conventional operational amplifier 100 (FIG. 3) were calculated and the results are shown in Table 1.

TABLE 1

|  | operational amplifier 10 | operational amplifier 20 | operational amplifier 100 |
| --- | --- | --- | --- |
| through rate (V/#s) | 193 | 211 | 165 |
| phase margin [deg] | 26.4 | 26.3 | 16.6 |

As may be seen in Table 1, the phase margin and the through rate of the operational amplifier 10 of one embodiment is improved over the conventional operational amplifier 100. The operational amplifier 20 of the other embodiment exhibits even better through rate characteristics.

In the above-description of the operational amplifiers according to the embodiments of the present invention, two first input transistors and two second input transistors are connected in parallel, respectively. However, the numbers of the first and second input transistors may be further increased, provided that the first and second input transistors are connected in parallel, respectively. As the number of input transistors is increased, the input impedance of the buffer circuit is correspondingly and advantageously decreased.

According to an aspect of the present invention, the buffer circuit includes a plurality of first input transistors connected in parallel and a plurality of second input transistors connected in parallel. A current which flows in the buffer circuit from the current mirror stage can be divided to flow in the plurality of first input transistors and in the plurality of second input transistors. Accordingly, the quantity of current capable of being processed in the buffer circuit can be increased. The mutual conductance of the differential amplifier stage in which a voltage is converted into a current can thus be enhanced. Therefore, the operational amplifier can operate at high speeds and over wide bandwidths. Further, the operational amplifier exhibits high speed and wide bandwidth operation without requiring a significant increase in the current consumption by the buffer circuit.

Moreover, the respective impedances of the plurality of first input transistors and the plurality of second input transistors are in parallel, resulting in a reduced input impedance of the buffer circuit. Hence, the first pole frequency at which the gain begins to roll off (45° phase lag) is shifted toward higher frequencies and, thus permits wide bandwidth operation.

In addition, since the respective plurality of first input transistors and plurality of second input transistors are connected in parallel, the respective combined base resistances are reduced. Since the cut-off frequencies of the plurality of first input transistors and the plurality of second input transistors are shifted toward higher frequencies, the operational amplifier exhibits wide band-width operation. In addition, the phase margin and the through rate of the operational amplifier, which are inversely proportional to the combined base resistance, can be enhanced.

According to another aspect of the present invention, the buffer circuit has a diamond arrangement formed of at least one of the plurality of first input transistors, at least one of the plurality of second input transistors, and the first and second output transistors. Thus, the first and second input transistors and the first and second output transistors in the diamond arrangement operate as emitter followers (common-collectors). Hence, the high frequency characteristics of the operational amplifiers 10, 20 are enhanced, and the skew is also improved. Wide bandwidth operation can be achieved with stability.

According to still another aspect of the present invention, the remainder of the parallel-connected plurality of first input transistors and the remainder of the parallel-connected plurality of second input transistors are directly tied together and connected to the output. Hence, the collector—emitter voltages of the remainder of the plurality of first input transistors and the remainder of the plurality of second input transistors are reduced. As a result, the current consumption in the buffer circuit is reduced. In correspondence with the reduced current consumption, more current can flow in the differential amplifier stage, thereby increasing the mutual conductance of the differential amplifier stage. Thus, the through rate of the operational amplifier is enhanced.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An operational amplifier, comprising:
   a differential amplifier stage having a pair of differential amplifier circuits operable to receive positive and negative input signals and produce two outputs;
   a current mirror stage having a pair of current mirror circuits connected to a respective one of the outputs of the differential amplifier stage, the current mirror circuits producing a common output from an output terminal thereof;
   a buffer circuit having a first set of input transistors connected to the output terminal of the current mirror circuits, respectively, and a second set of input transistors connected to the output terminal of the current mirror circuits, respectively, and the first and second sets of transistors receiving input from the common output of the current mirror stage, each of the first set of input transistors and each of the second set of input transistors includes a control terminal, a first output terminal, and a second output terminal, the respective control terminals and first output terminals of the first set of input transistors are coupled together, the respective control terminals and first output terminals of the second set of input transistors are coupled together, and first and second series coupled output transistors connected from a first voltage potential to a lower voltage potential, the first and second series coupled output transistors each including a control terminal and forming a common output node, the respective first output terminals of the second set of input transistors being connected to the control terminal of the first output transistor, at least one of the second output terminals of the second set of input transistors being connected to the lower voltage potential, at least one of the second output terminals of the second set of input transistors being connected to the common output node, and the respective first output terminals of the first set of input transistors being connected to the control terminal of the second output transistor, at least one of the respective second output terminals of the first set of input transistors being connected to the upper voltage potential, and at least one of the respective second output terminals of the first set of input transistors being connected to the common output node.

2. An operational amplifier according to claim 1, wherein the buffer circuit includes:
   a first current source receiving a first current control output from the current mirror stage and sourceing current into the second set of input transistors; and
   a second current source receiving a second current control output from the current mirror stage and sourceing current into the first set of input transistors.

3. An operational amplifier according to claim 1, wherein the buffer circuit includes:
   a first current source being connected between the upper voltage potential and a node where the control terminal of the first output transistor and the respective first output terminals of the second set of input transistors are connected, and sourceing current into the second set of input transistors; and
   a second current source being connected between the lower voltage potential and a node where the control terminal of the second output transistor and the respective first output terminals of the first set of input transistors are connected, and sourceing current into the first set of input transistors.

4. An operational amplifier according to claim 3, wherein said first current source receives a first current control output from the current mirror stage; and
   said second current source receives a second current control output from the current mirror stage.

5. An operational amplifier according to claim 1, wherein a collector output of the current mirror circuits is supplied to the control terminals of the first and second set of input transistors.

* * * * *